United States Patent
Liao et al.

(10) Patent No.: US 11,862,493 B2
(45) Date of Patent: *Jan. 2, 2024

(54) CORRECTING COMPONENT FAILURES IN ION IMPLANT SEMICONDUCTOR MANUFACTURING TOOL

(71) Applicant: Applied Materials, Inc., Santa Clara, CA (US)

(72) Inventors: Tianqing Liao, Mountain View, CA (US); Sima Didari, San Jose, CA (US); Harikrishnan Rajagopal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,408

(22) Filed: May 27, 2022

(65) Prior Publication Data

US 2022/0301903 A1 Sep. 22, 2022

Related U.S. Application Data

(63) Continuation of application No. 16/264,034, filed on Jan. 31, 2019, now Pat. No. 11,348,813.

(51) Int. Cl.
*H01L 21/06* (2006.01)
*G05B 23/02* (2006.01)
(Continued)

(52) U.S. Cl.
CPC ...... *H01L 21/67213* (2013.01); *G05B 23/024* (2013.01); *G05B 23/0254* (2013.01);
(Continued)

(58) Field of Classification Search
None
See application file for complete search history.

(56) References Cited

U.S. PATENT DOCUMENTS 6,055,460 A 4/2000 Shopbell
6,960,774 B2 * 11/2005 Coss, Jr. ............. H01J 37/3023
 700/121
(Continued)

FOREIGN PATENT DOCUMENTS

CN 109283800 A 1/2019
JP H0613015 A 1/1994
(Continued)

OTHER PUBLICATIONS

International Search Report and Written Opinion dated May 15, 2020, on application No. PCT/US/2020/014197.
(Continued)

*Primary Examiner* — Michael J Dalbo
*Assistant Examiner* — Denise R Karavias
(74) *Attorney, Agent, or Firm* — Lowenstein Sandler LLP

(57) ABSTRACT

A method includes determining, based on sensor data, that one or more components of substrate processing equipment are within a pre-failure window that is after a normal operation window. Corresponding data points in the normal operation window are substantially stable along a first health index value. The corresponding data points in the pre-failure window increase from the first health index value to a peak at a second health index value. Responsive to the determining that the one or more components are within the pre-failure window, the method further includes causing performance of a corrective action associated with the one or more components of the substrate processing equipment.

20 Claims, 8 Drawing Sheets

(51) Int. Cl.
  *G06F 16/28* (2019.01)
  *H01J 37/317* (2006.01)
  *H01L 21/67* (2006.01)
  *G06N 20/00* (2019.01)

(52) U.S. Cl.
  CPC ...... *G05B 23/0283* (2013.01); *H01J 37/3171* (2013.01); *G06F 16/285* (2019.01); *G06N 20/00* (2019.01)

(56) References Cited

U.S. PATENT DOCUMENTS

| | | | |
|---|---|---|---|
| 7,755,066 | B2 | 7/2010 | Evans |
| 11,003,518 | B2* | 5/2021 | Lopez ................ G06F 11/008 |
| 2009/0228408 | A1* | 9/2009 | Kaushal ................ G06N 5/04 |
| | | | 714/26 |
| 2017/0109646 | A1 | 4/2017 | David |
| 2017/0364818 | A1 | 12/2017 | Wu et al. |
| 2018/0210991 | A1 | 7/2018 | Huang et al. |
| 2018/0294174 | A1* | 10/2018 | Fujikata ............ H01L 21/67086 |

FOREIGN PATENT DOCUMENTS

| | | |
|---|---|---|
| JP | H08153486 A | 6/1996 |
| JP | H0982266 A | 3/1997 |
| JP | H1012180 A | 1/1998 |
| JP | 2002231597 A | 8/2002 |
| JP | 2003077907 A | 3/2003 |
| JP | 2016045808 A | 4/2016 |
| JP | 2018178157 A | 11/2018 |
| JP | 2020086694 A | 6/2020 |
| KR | 101744194 B1 | 6/2017 |
| TW | 201804471 A | 2/2018 |

OTHER PUBLICATIONS

IP.com Machine Translation, Han Young Shin et al., "Method and Apparatus for Classification and rediction of Automatic Checking Fail for Wafer using Euclidean Distance in Semiconductor FAD Manufacturing," KR 10-1744194 31, Jun. 9, 2017 (Year: 2017).

Espacenet, Maching Translation, Cai Zhibuan et al., "Deep-learning-based method for intermittent process fault detection," CN109116834A, Jan. 1, 2019 (Year: 2019).

Espacenet, Machine Translation, Huang Tianfu et al., "Electric energy metering device abnormality detecting method based on long short term memory model," CN 108761377 A, Nov. 6, 2018 (Year: 2018).

* cited by examiner

CORRECTING COMPONENT FAILURES IN ION IMPLANT SEMICONDUCTOR MANUFACTURING TOOL

RELATED APPLICATIONS

This application is a continuation application of U.S. patent application Ser. No. 16/264,034, filed Jan. 31, 2019, which is incorporated by reference in its entirety.

TECHNICAL FIELD

The present disclosure relates to correcting component failures, and, more particularly, correcting component failures in semiconductor manufacturing tools.

BACKGROUND

One of the limiting factors of uninterrupted performance of manufacturing equipment is component failures. For example, failure of flood guns and source guns may interrupt performance of ion implant tools. Failure of components leads to unplanned down time which is a high cost for users.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method may include receiving, from a plurality of sensors associated with an ion implant tool, current sensor data corresponding to a plurality of features. The method may further include performing feature analysis to generate a plurality of additional features for the current sensor data. The method may further include providing the plurality of additional features as input to a trained machine learning model. The method may further include obtaining one or more outputs from the trained machine learning model. The one or more outputs may be indicative of a level of confidence of a predicted window. The method may further include predicting, based on the level of confidence of the predicted window, whether one or more components of the ion implant tool are within a pre-failure window. The method may further include, responsive to predicting that the one or more components are within the pre-failure window, performing a corrective action associated with the ion implant tool.

In a further aspect of the disclosure, a method may include receiving, from a plurality of sensors associated with an ion implant tool, historical sensor data corresponding to a plurality of features. The method may further include determining a plurality of windows comprising a normal operation window for a first subset of the historical sensor data and a pre-failure window for a second subset of the historical sensor data. The method may further include performing feature analysis to generate a plurality of additional features for the historical sensor data. The method may further include training a machine learning model using training data including the plurality of additional features and target output including the plurality of windows to generate a trained machine learning model. The trained machine learning model may be capable of generating one or more outputs indicative of whether one or more ion implant tool components are within the pre-failure window.

In a further aspect of the disclosure, a system may include a memory and a processing device coupled to the memory. The processing device may receive, from a plurality of sensors associated with an ion implant tool, current sensor data corresponding to a plurality of features. The processing device may further perform feature analysis to generate a plurality of additional features for the current sensor data. The processing device may further provide the plurality of additional features as input to a trained machine learning model. The processing device may further obtain one or more outputs from the trained machine learning model. The one or more outputs may be indicative of a level of confidence of a predicted window. The processing device may further predict, based on the level of confidence of the predicted window, whether one or more components of the ion implant tool are within a pre-failure window. The processing device may further, responsive to predicting that the one or more components are within the pre-failure window, perform a corrective action associated with the ion implant tool.

BRIEF DESCRIPTION OF THE DRAWINGS

The present disclosure is illustrated by way of example, and not by way of limitation in the figures of the accompanying drawings.

DETAILED DESCRIPTION

Figure 1:
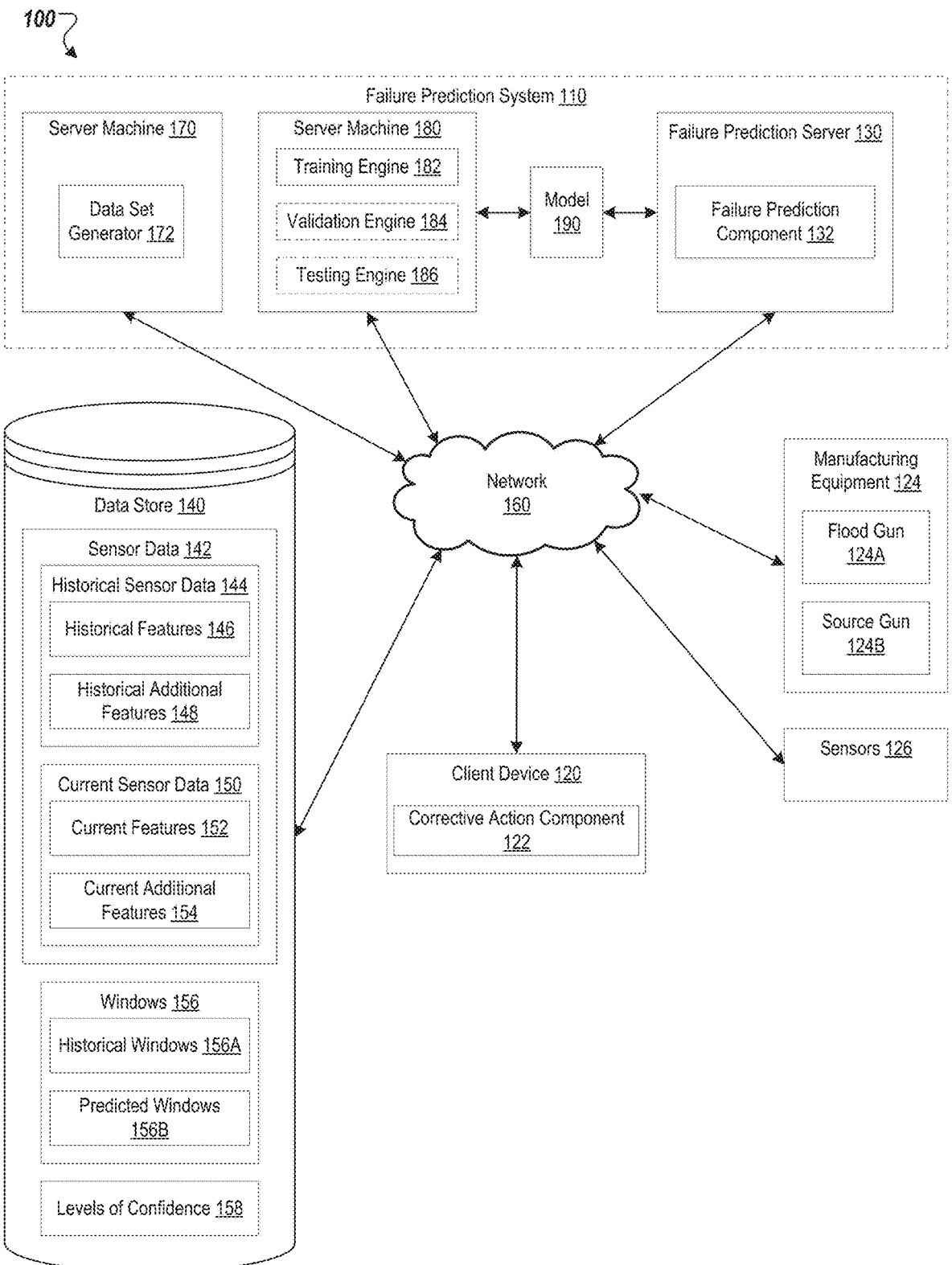
FIG. 1 is a block diagram illustrating an exemplary system architecture, according to certain embodiments.

The devices, systems, and methods disclosed herein provide correcting component failures in semiconductor manufacturing tools (e.g., end of life prediction for the plasma source gun in an ion implant semiconductor manufacturing tool). The devices, systems, and methods disclosed herein may provide critical component failure prediction (e.g., by using a deep learning model) for ion implanting tools using derived sensor readings. A processing device may receive, from a plurality of sensors associated with manufacturing equipment (e.g., an ion implant tool), current sensor data corresponding to features (e.g., pressure, temperature, flow, power, etc.). The processing device may further perform feature analysis to generate additional features for the current sensor data. Additional features may be generated based on one or more features. For example, additional features may include one or more of a ratio, a range, delta, a maximum value, etc. The processing device may further provide the additional features as input to a trained machine learning model and subsequently obtain one or more outputs from the trained machine learning model. The one or more outputs may be indicative of a level of confidence of a predicted window. The processing device may predict, based on the level of confidence of the predicted window, whether one or more components of the ion implant tool are within a pre-failure window. A pre-failure window may be a window of time (e.g., 24 hours, 48 hours) before failure of a component is predicted to occur. The processing device may further, responsive to predicting that the one or more components are within the pre-failure window, perform a corrective action associated with the ion implant tool. The corrective action (e.g., correcting and/or preemptively correcting component failures) may include providing an alert, interrupting operation of the manufacturing equipment, and/or causing the one or more components to be replaced.

The devices, systems, and methods disclosed herein provide correcting component failures in semiconductor manufacturing tools (e.g., end of life prediction for the plasma source gun in an ion implant semiconductor manufacturing tool). The devices, systems, and methods disclosed herein may provide critical component failure prediction (e.g., by using a deep learning model) for ion implanting tools using derived sensor readings. A processing device may receive, from a plurality of sensors associated with manufacturing equipment (e.g., an ion implant tool), current sensor data corresponding to features (e.g., pressure, temperature, flow, power, etc.). The processing device may further perform feature analysis to generate additional features for the current sensor data. Additional features may be generated based on one or features. For example, additional features may include one or more of a ratio, a range, delta, a maximum value, etc. The processing device may further provide the additional features as input to a trained machine learning model and subsequently obtain one or more outputs from the trained machine learning model. The one or more outputs may be indicative of a level of confidence of a predicted window. The processing device may predict, based on the level of confidence of the predicted window, whether one or more components of the ion implant tool are within a pre-failure window. A pre-failure window may be a window of time (e.g., 24 hours, 48 hours) before failure of a component is predicted to occur. The processing device may further, responsive to predicting that the one or more components are within the pre-failure window, perform a corrective action associated with the ion implant tool. The corrective action (e.g., correcting and/or preemptively correcting component failures) may include providing an alert, interrupting operation of the manufacturing equipment, and/or causing the one or more components to be replaced.

The devices, systems, and methods disclosed herein also provide training of a machine learning model for prediction of failure of components. In some embodiments, a processing device may receive, from sensors associated with manufacturing equipment (e.g., an ion implant tool), historical sensor data corresponding to features (e.g., historical values for sensor, pressure, flow, power, etc. data). The processing device may further determine windows corresponding to the historical sensor data. The windows may include a normal operation window for a first subset of the historical sensor data and a pre-failure window for a second subset of the historical sensor data. The processing device may further perform feature analysis to generate additional features for the historical sensor data (e.g., ratio, range, delta, maximum, etc.). The processing device may further train a machine learning model using training data including the additional features and target output including the windows to generate a trained machine learning model. The trained machine learning model may be capable of generating one or more outputs indicative of whether one or more components (e.g., ion implant tool components) are within the pre-failure window (e.g., to perform corrective action associated with one or more components of ion implant tools). The machine learning model may be trained using historical sensor data associated with first manufacturing equipment and may be used to predict component failure for other manufacturing equipment.

Aspects of the present disclosure also result in technological advantages. Conventionally, a component is used until failure or is replaced prematurely. By a processing device predicting a pre-failure window (e.g., end of life, 24 hours, 48 hours) for one or more components, the processing device may cause corrective action so that the one or more components are replaced before failure. Replacing the components before failure (e.g., instead of after failure) reduces downtime, reduces damage to the manufacturing equipment and products, reduces unscheduled maintenance, reduces expedited shipping of replacement components, etc. Replacing the components within the pre-failure window (e.g., instead of arbitrarily replacing components very prematurely) reduces waste of current components that still are usable, reduces cost associated with too frequently replacing components, reduces maintenance, etc. Receiving sensor data, reducing noise, and performing feature analysis (prior to using the trained machine learning model to predict whether one or more components are within the pre-failure window) provides significant reduction in energy consumption (e.g., battery consumption), bandwidth, latency, and so forth compared to analyzing all of the sensor data (e.g., including noise and all of the features).

FIG. 1 is a block diagram illustrating an exemplary system architecture 100, according to certain embodiments. The system architecture 100 includes client device 120, failure prediction server 130, and a data store 140. The failure prediction server 130 may be part of a failure prediction system 110.

The client device 120, failure prediction server 130, data store 140, server machine 170, server machine 180, manufacturing equipment 124 (e.g., ion implant tools, etc.), and sensors 126 may be coupled to each other via a network 160 for failure prediction. In some embodiments, network 160 is a public network that provides client device 120 with access to the failure prediction server 130, data store 140, and other publicly available computing devices. In some embodiments, network 160 is a private network that provides client device 120 with access to the failure prediction server 130, data store 140, and other privately available computing devices. Network 160 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, and/or a combination thereof.

The manufacturing equipment 124 may be used for semiconductor processing. The manufacturing equipment 124 may include an ion implant tool. An ion implant tool may insert atoms into a semiconductor device to control the flow of electricity through the semiconductor device (e.g., to make transistors, etc.). The manufacturing equipment 124 (e.g., ion implant tool) may include components, such as flood gun 124A, source gun 124B, etc. A flood gun 124A may be an electromechanical device that provides a steady flow of low-energy electrons to a target (e.g., flood area, an area on an insulator or a semiconductor). A source gun 124B (e.g., plasma source gun) may be a plasma source for depositing plasma on a semiconductor device (e.g., eject plasma with a significant streaming velocity to have an energetic deposition of the plasma on the semiconductor device).

A limiting factor of uninterrupted performance of the manufacturing equipment 124 (e.g., ion implant tool) may be failure of one or more components (e.g., flood gun 124A, source gun 124B, etc.) which may lead to unplanned down time. Sensors 126 may capture sensor data (e.g., raw sensor data, temperature, pressure, power, flow, etc.) associated with the manufacturing equipment 124. For example, an ion implanter tool may be equipped with hundreds of sensors with acquisition speed of thousands of hertz. Given the number of sensors, speed of acquisition of sensor data, and life expectancy of components (e.g., six months, etc.), the volume of sensor data (e.g., raw sensor data) captured may be very large. The sensor data 142 from sensors 126 may be stored in the data store 140.

The client device 120 may include a computing device such as personal computers (PCs), laptops, mobile phones, smart phones, tablet computers, netbook computers, network connected televisions ("smart TV"), network-connected media players (e.g., Blu-ray player), a set-top-box, over-the-top (OTT) streaming devices, operator boxes, etc. The client device 120 may be capable of transmitting information (e.g., a selection of manufacturing equipment 124 for the failure prediction) via network 160 and receiving indications associated with a predicted failure (e.g., level of confidence of a predicted window, instructions to execute a corrective action, etc.) via network 160. The instructions associated with a predicted failure may specify that one or more components of the manufacturing equipment 124 are currently associated with a predicted window 156B of time (e.g., normal operation window, a pre-failure window, a failure window, etc.). The instructions associated with a predicted failure may indicate one or more of an amount of time until failure, components that are to be replaced, how to replace the components, whether operation of the manufacturing equipment 124 has been interrupted (e.g., has been shut down), or whether operation of the manufacturing equipment 124 should be interrupted. The client device 120 may display an alert via a graphical user interface (GUI) responsive to receiving the indications associated with a predicted failure. Each client device 120 may include an operating system that allows users to generate, view, and edit information and view alerts.

The client device 120 may include a computing device such as personal computers (PCs), laptops, mobile phones, smart phones, tablet computers, netbook computers, network connected televisions ("smart TV"), network-connected media players (e.g., Blu-ray player), a set-top-box, over-the-top (OTT) streaming devices, operator boxes, etc. The client device 120 may be capable of transmitting information (e.g., a selection of manufacturing equipment 124 for the failure prediction) via network 160 and receiving indications associated a predicted failure (e.g., level of confidence of a predicted window, instructions to execute a corrective action, etc.) via network 160. The instructions associated with a predicted failure may specify that one or more components of the manufacturing equipment 124 are currently associated with a predicted window 156B of time (e.g., normal operation window, a pre-failure window, a failure window, etc.). The instructions associated with a predicted failure may indicate one or more of an amount of time until failure, components that are to be replaced, how to replace the components, whether operation of the manufacturing equipment 124 has been interrupted (e.g., has been shut down), or whether operation of the manufacturing equipment 124 should be interrupted. The client device 120 may display an alert via a graphical user interface (GUI) responsive to receiving the indications associated with a predicted failure. Each client device 120 may include an operating system that allows users to generate, view, and edit information and view alerts.

The client device 120 may include a corrective action component 122. Corrective action component 122 may receive user input (e.g., via a GUI displayed via the client device 120) and may generate, based on the user input, an indication that failure prediction is to be executed for manufacturing equipment 124. The corrective action component 122 may transmit the indication to the failure prediction server 130. In some embodiments, corrective action component 122 transmits sensor data 142 (e.g., from sensors 126 coupled to manufacturing equipment 124) to failure prediction server 130. The corrective action component 122 may receive an indication associated with a predicted failure from the failure prediction server 130 (e.g., responsive to the failure prediction server 130 determining a pre-failure window). The corrective action component 122 may cause a corrective action to be performed. A corrective action may refer to correcting and/or preemptively correcting component failures (e.g., based on predicting a pre-failure window). For example, to cause a corrective action to be performed, corrective action component 122 may provide an alert (e.g., via a GUI of client device 120, via manufacturing equipment 124, etc.), may interrupt operation of the manufacturing equipment 124 (e.g., shut down one or more portions of the manufacturing equipment 124), and/or may cause the one or more components to be replaced.

The failure prediction server 130 may include one or more computing devices such as a rackmount server, a router computer, a server computer, a personal computer, a mainframe computer, a laptop computer, a tablet computer, a desktop computer, etc. The failure prediction server 130 may include a failure prediction component 132. In some embodiments, the failure prediction component 132 may receive sensor data 142 (e.g., from sensors 126 coupled to manufacturing equipment 124). The sensor data 142 may include recorded values over time and a corresponding time stamp for each value (e.g., a first recorded temperature at a first point in time, a second recorded temperature at a second point in time, etc.). The sensor data 142 may be raw trace data (e.g., without any feature engineering). The failure prediction component 132 may remove noise from current sensor data 150, perform feature analysis to generate additional features for the current sensor data 150, predict whether one or more components of the manufacturing equipment 124 are within a pre-failure window, and perform a corrective action associated with the manufacturing equipment 124 responsive to predicting the one or more components are within the pre-failure window.

To predict whether components are within the pre-failure window, the failure prediction component 132 may provide the current sensor data 150 (e.g., current additional features 154) to the model 190 (e.g., a convolutional long short-term memory (LSTM) (convLSTM) model, a deep learning model, a random forest model, etc.) for failure prediction. The failure prediction component 132 may receive a level of confidence 158 for a predicted window 156B from the model 190 based on the current sensor data 150.

Each feature (e.g., historical feature 146, current feature 152, etc.) of the sensor data 150 may include a sequence (e.g., first value, second value, etc.), timestamps (e.g., time at first value, time at second value, etc.), and an indication of which sensor 126 corresponds to the sequence. Each additional feature (e.g., historical additional feature 148, current additional feature 154) may be generated by performing one or more operations on one or more of the features. The one or more operations may include one or more of a ratio, a range, a delta, or a maximum value of features (e.g., corresponding sensor data) from one or more of the plurality of sensors 126. For example, a first feature may be a sequence of pressure measurements received from a pressure sensor of the sensors 126, a second feature may be a sequence of temperature measurements received from a temperature sensor of the sensors 126, and a first additional feature may be a ratio of the sequence of pressure measurements divided by each corresponding temperature measurement (e.g., first additional feature may be a sequence including a first pressure value at a first point in time divided by a first temperature value at the first point in time, a second pressure value at a second point in time divided by a second temperature value at the second point in time, etc.).

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store one or more of sensor data 142 (e.g., historical sensor data 144, historical features 146, historical additional features 148, current sensor data 150, current features 152, current additional features 154, etc.), windows 156 (e.g., historical windows 156A, predicted windows 156B), levels of confidence 158, etc.

In some embodiments, failure prediction system 110 further includes server machine 170 and server machine 180. The server machines 170 and 180 may be one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components.

Figure 2:
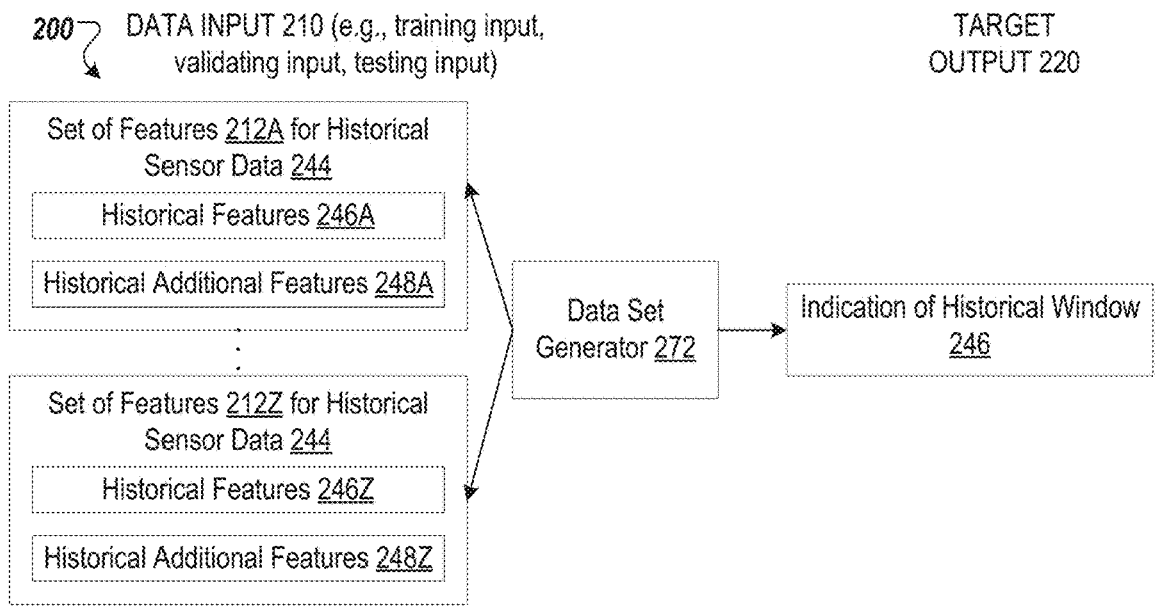
FIG. 2 is an example data set generator to create data sets for a machine learning model, according to certain embodiments.

Server machine 170 includes a data set generator 172 that is capable of generating one or more data sets (e.g., a set of data inputs 210 and a set of target outputs 220 in FIG. 2) to train, validate, or test a machine learning model 190. Some operations of data set generator 172 are described in detail below with respect to FIGS. 2 and 6. In some embodiments, the data set generator 172 may partition the historical sensor data 144 into a training set (e.g., sixty percent of the historical sensor data 144), a validating set (e.g., twenty percent of the historical sensor data 144), and a testing set (e.g., twenty percent of the historical sensor data 144). Server machine 180 includes a training engine 182. In some embodiments, server machine 180 includes a training engine 182, a validation engine 184, and a testing engine 186. The training engine 182 may be capable of training a machine learning model 190 using the training set from data set generator 172. The training engine 182 may generate one or more trained machine learning models 190.

The validation engine 184 may be capable of validating a trained machine learning model 190 using the validation set from data set generator 172. The validation engine 184 may determine an accuracy of each of the trained machine learning models 190 based on the validation set. The validation engine 184 may discard trained machine learning models 190 that have an accuracy that does not meet a threshold accuracy.

The testing engine 186 may be capable of testing a trained machine learning model 190 using a testing set from data set generator 172. The testing engine 186 may determine a trained machine learning model 190 that has the highest accuracy of all of the trained machine learning models based on the testing sets.

The machine learning model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. In some embodiments, the machine learning model 190 may use one or more LSTM layers and a softmax layer (see FIGS. 7A-B).

In some embodiments, the failure prediction component 132 may provide the historical sensor data 144 and historical windows 156A to the data set generator 172. The data set generator 172 may provide the historical sensor data 144 as input and the historical windows 156 as output to one or more of training engine 182, validation engine 184, and/or testing engine 186 to one or more of train, validate, or test the machine learning model 190.

In some embodiments, the failure prediction system 110 may generate different models 190 based on one or more of different hyperparameters (e.g., different numbers of LSTM layers), different types of machine learning models, different sets of historical additional features 148, etc. The failure prediction system 110 may one or more of train, validate, or test the different models 190 and select the model 190 that is most accurate.

In some embodiments, failure prediction component 132 may provide the current sensor data 150 as input to the trained machine learning model 190, and run trained machine learning model 190 on the input to obtain one or more outputs. As described in detail below with respect to FIG. 4, failure prediction component 132 may be capable of determining a predicted window 156B (e.g., based on the output of the trained machine learning model 190, by extracting a level of confidence of the predicted window 156B from the output, etc.). The failure prediction component 132 may also determine confidence data based on the output. The confidence data may indicate a level of confidence that the predicted window 156B corresponds to the manufacturing equipment 124. The failure prediction component 132 may use the levels of confidence 158 to select the predicted window 156B.

The failure prediction component 132 may determine multiple predicted windows 156B and corresponding levels of confidence 158 based on the output of the model 190 (e.g., 10% level of confidence for a normal operation window and 90% level of confidence for a pre-failure operation window). In some embodiments, the failure prediction component 132 selects the predicted window with the highest level of confidence. In some embodiments, the failure prediction component 132 selects the predicted window that has a level of confidence over 50%.

The failure prediction component 132 may determine multiple predicted windows 156B and corresponding levels of confidence 158 based on the output of the model 190 (e.g., 10% level of confidence that normal operation window and 90% level of confidence that pre-failure operation window). In some embodiments, the failure prediction component 132 selects the predicted window with the highest level of confidence. In some embodiments, the failure prediction component 132 selects the predicted window that has a level of confidence over 50%.

For purpose of illustration, rather than limitation, aspects of the disclosure describe the training of a machine learning model and use of a trained learning model using current sensor data 150 to determine predicted windows 156B. In other implementations, a heuristic model or rule-based model is used to determine predicted windows 156 based on sensor data 142 (e.g., historical sensor data 144, current sensor data 150, etc.). Any of the information described with respect to data inputs 210 of FIG. 2 may be monitored or otherwise used in the heuristic or rule-based model.

In some embodiments, the functions of client device 120, failure prediction server 130, server machine 170, and server machine 180 may be provided by a fewer number of machines. For example, in some embodiments server machines 170 and 180 may be integrated into a single machine. In some other embodiments, server machine 170, server machine 180, and failure prediction server 130 may be integrated into a single machine.

In general, functions described in one embodiment as being performed by client device 120, server machine 170, and server machine 180 can also be performed on failure prediction server 130 in other embodiments, if appropriate. In addition, the functionality attributed to a particular component can be performed by different or multiple components operating together. For example, in some embodiments, the failure prediction server 130 may receive the user input indicating manufacturing equipment 124 (e.g., a semiconductor processing tool) for the failure prediction and the failure prediction server 130 may provide the alert, shut down the manufacturing equipment 124, etc. based on the level of confidence 158 of the predicted window 156B. In another example, client device 120 may one or more of remove noise from the sensor data 142, perform feature analysis on the sensor data 142, determine the level of confidence 158 of the predicted windows 156B, predict whether the one or more components are within the pre-failure window, or perform the corrective action. In another example, the data set generator 172 may remove the noise from the historical sensor data 144 and perform feature analysis on the historical sensor data 144.

In addition, the functions of a particular component can be performed by different or multiple components operating together. One or more of the failure prediction server 130, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Although embodiments of the disclosure are discussed in terms of sensor data 150 received from sensors 126 coupled to manufacturing equipment 124, embodiments may also be generally applied to data received over time (e.g., irregular time series data, etc.). Embodiments may be generally applied to optimizing processes that generate data over time. Examples of manufacturing equipment 124 for wafer or display manufacturing are physical vapor deposition (PVD) equipment, chemical vapor deposition (CVD) equipment, atomic layer deposition (ALD) equipment, chemical mechanical polishing (CMP) equipment, and etch equipment.

FIG. 2 is an example data set generator 272 (e.g., data set generator 172 of FIG. 1) to create data sets for a machine learning model 290 (e.g., model 190 of FIG. 1) using historical sensor data 244 (e.g., historical sensor data 144 of FIG. 1), according to certain embodiments. System 200 of FIG. 2 shows data set generator 272, data inputs 210, and target outputs 220.

In some embodiments, data set generator 272 generates a data set (e.g., training set, validating set, testing set) that includes one or more data inputs 210 (e.g., training input, validating input, testing input) and one or more target outputs 220. The data set may also include mapping data that maps the data inputs 210 to the target outputs 220. Data inputs 210 may also be referred to as "features," "attributes," or "information." In some embodiments, data set generator 272 may provide the data set to one or more of the training engine 182, validating engine 184, or testing engine 186, where the data set is used to train, validate, or test the machine learning model 190. Some embodiments of generating a training set may further be described with respect to FIG. 6.

In some embodiments, data inputs 210 may include one or more sets of features 212A for the historical sensor data 244. Each set of features 212 may include at least one of a historical feature 246 (e.g., historical feature 146 of FIG. 1) or a historical additional feature 248 (e.g., historical additional feature 148 of FIG. 1). For example, a set of features 212 may include one or more historical additional features 248.

In some embodiments, data set generator 272 may generate a first data input 210A corresponding to a first set of features 212A to train, validate, or test a first machine learning model and the data set generator 272 may generate a second data input 210B corresponding to a second set of features 212B to train, validate, or test a second machine learning model.

Data inputs 210 and target outputs 220 to train, validate, or test a machine learning model may include information from a particular facility (e.g., from a particular semiconductor manufacturing facility). For example, the historical sensor data 244 may be from the same manufacturing facility as the current sensor data 150 of FIG. 1. In some embodiments, the information used to train the machine learning model may be from specific groups of components of the manufacturing facility having specific characteristics (e.g., components from a specific timeframe, components for a specific type of manufacturing equipment, etc.) and allow the trained machine learning model to predict pre-failure windows for a specific group of components based on historical sensor data associated with one or more components sharing characteristics of the specific group. In some embodiments, the information used to train the machine learning model may be for components from two or more manufacturing facilities and may allow the trained machine learning model to determine outcomes for components based on input from one manufacturing facility. In some embodiments, the information used to train the machine learning model may be associated with one or more first ion implant tools and the trained machine learning model may be used to predict component failure for one or more second ion implant tools that are different from the one or more first ion implant tools.

Data inputs 210 and target outputs 220 to train, validate, or test a machine learning model may include information form a particular facility (e.g., from a particular semiconductor manufacturing facility). For example, the historical sensor data 244 may be form the same manufacturing facility as the current sensor data 150 of FIG. 1. In some embodiments, the information used to train the machine learning model may be from specific groups of components of the manufacturing facility having specific characteristics (e.g., components from a specific timeframe, components for a specific type of manufacturing equipment, etc.) and allow the trained machine learning model to predict pre-failure windows for a specific group of components based on historical sensor data associated with one or more components sharing characteristics of the specific group. In some embodiments, the information used to train the machine learning model may be for components from two or more manufacturing facilities and may allow the trained machine learning model to determine outcomes for components based on input from one manufacturing facility. In some embodiments, the information used to train the machine learning model may be associated with one or more first ion implant tools and the trained machine learning model may be used to predict component failure for one or more second ion implant tools that are different from the one or more first ion implant tools.

In some embodiments, subsequent to generating a data input 210 and training, validating, or testing machine learning model 190 using the data set, the machine learning model 190 may be further trained, validated, or tested or adjusted (e.g., adjusting weights associated with input data of the machine learning model 190, such as connection weights in a neural network, tuning hyperparameters, etc.) using additional historical sensor data and corresponding historical windows from one or more manufacturing facilities.

Figure 3:
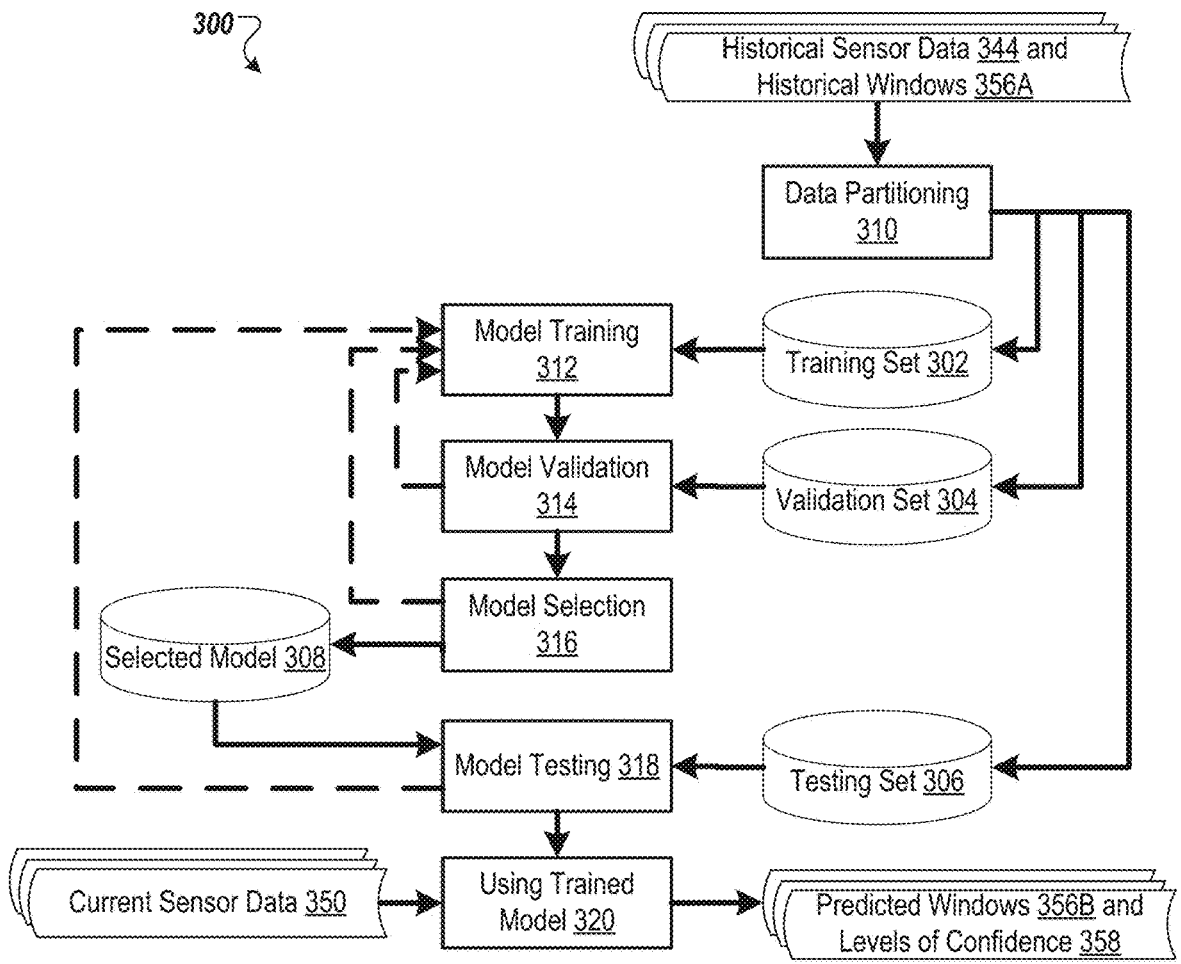
FIG. 3 is a block diagram illustrating a system for predicting component failure, according to certain embodiments.

FIG. 3 is a block diagram illustrating a system 300 for determining a level of confidence 358 (e.g., level of confidence 158 of FIG. 1) of predicted windows 356B (e.g., predicted windows 156B of FIG. 1). The system 300 may provide failure prediction for semiconductor manufacturing tools (e.g., end of life prediction for the plasma source gun in an ion implant semiconductor manufacturing tool).

At block 310, the system 300 (e.g., failure prediction system 110 of FIG. 1) performs data partitioning (e.g., via data set generator 172 of server machine 170 of FIG. 1) of the historical sensor data 344 (e.g., historical sensor data 144 of FIG. 1) to generate the training set 302, validation set 304, and testing set 306. In some embodiments, the system 300 generates a plurality of sets of features corresponding to each of the data sets.

At block 312, the system 300 performs model training (e.g., via training engine 182 of FIG. 1) using the training set 302. The system 300 may train multiple models using multiple sets of features of the training set 302 (e.g., a first set of features of the training set 302, a second set of features of the training set 302, etc.).

At block 314, the system 300 performs model validation (e.g., via validation engine 184 of FIG. 1) using the validation set 304. The system 300 may validate each of the trained models using a corresponding set of features of the validation set 304. At block 314, the system may determine an accuracy of each of the one or more trained models and may determine whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316.

At block 316, the system 300 performs model selection to determine which of the one or more trained models that meet the threshold accuracy has the highest accuracy (e.g., the selected model 308). Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. At block 318, the system 300 may determine whether accuracy of the selected model 308 meets a threshold accuracy using the testing set 306. Responsive to accuracy of the selected model 308 not meeting the threshold accuracy (e.g., the selected model 308 is overly fit to the validation set 304), flow continues to block 312 where the system 300 performs model training using different training sets corresponding to different sets of features. Responsive to determining that the selected model 308 has an accuracy that meets a threshold accuracy based on the testing set 306, flow continues to block 320. In at least block 312, the model may learn patterns in the historical sensor data to make predictions and in block 318, the system 300 may apply the model on the remaining data (e.g., testing set 306) to test the predictions.

In some embodiments, in addition to using different sets of features (e.g., different combinations of historical additional features 148) for one or more of training, validating, or testing of different models, the system 300 may also include different hyperparameters in the different models to determine which features and which hyperparameters provide the highest accuracy. In some embodiments, instead of using different sets of features for the one or more of training, validating or testing different models, the system 300 uses different hyperparameters in the different models (e.g., where each model uses the same set of historical additional features 148) to determine which hyperparameters provide the highest accuracy.

At block 320, system 300 uses the trained model (e.g., selected model 308) to receive current sensor data 350 (e.g., current sensor data 150 of FIG. 1) and to output a level of confidence 358 of a predicted window 356B (e.g., level of confidence 158 of a predicted window 156B of FIG. 1).

Responsive to receiving additional sensor data, the additional sensor data may be input into block 312 to update the trained model via model re-training.

Figure 4:
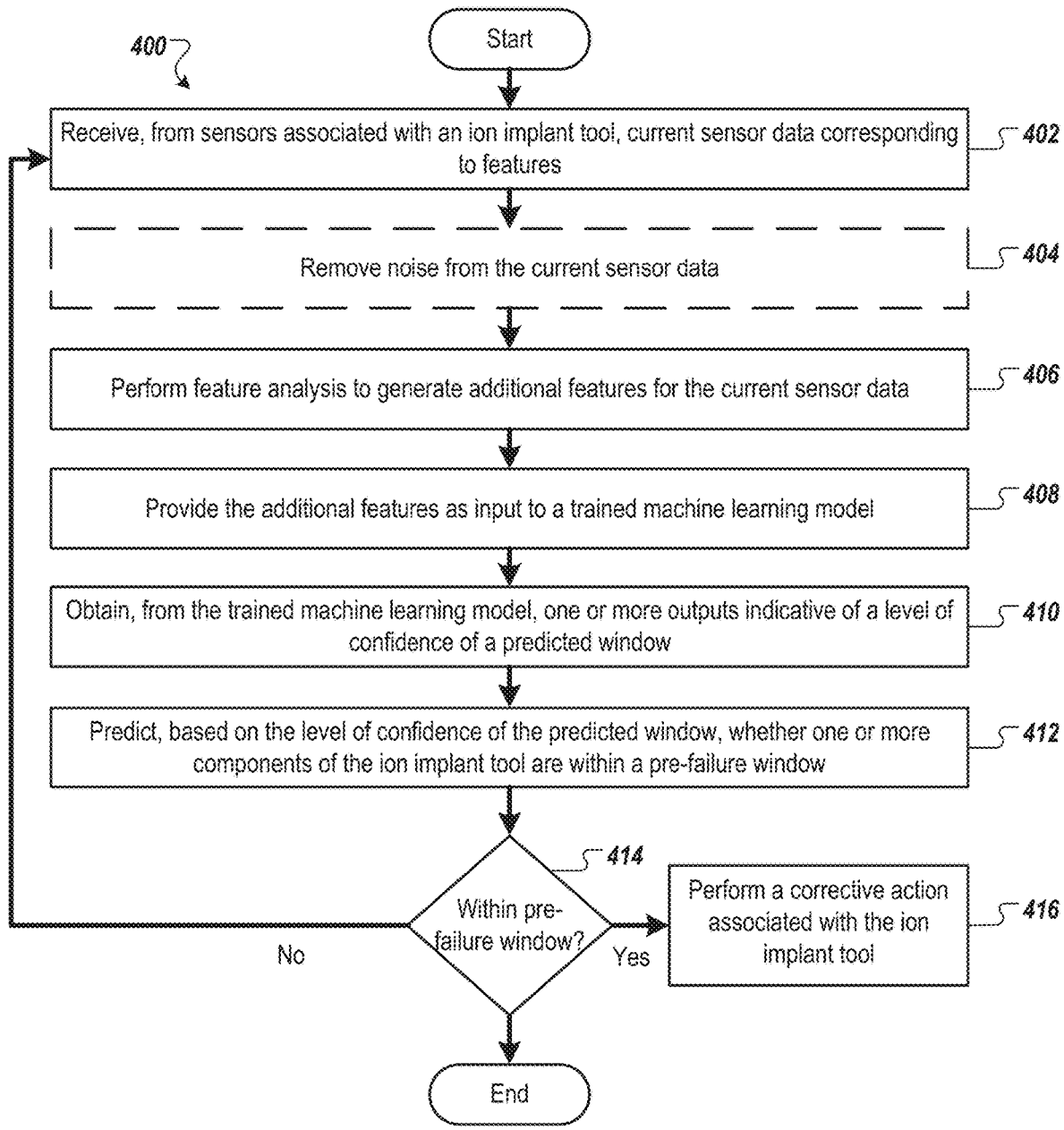
FIGS. 4-6 are flow diagrams illustrating example methods for predicting component failure, according to certain embodiments.
Figure 5:
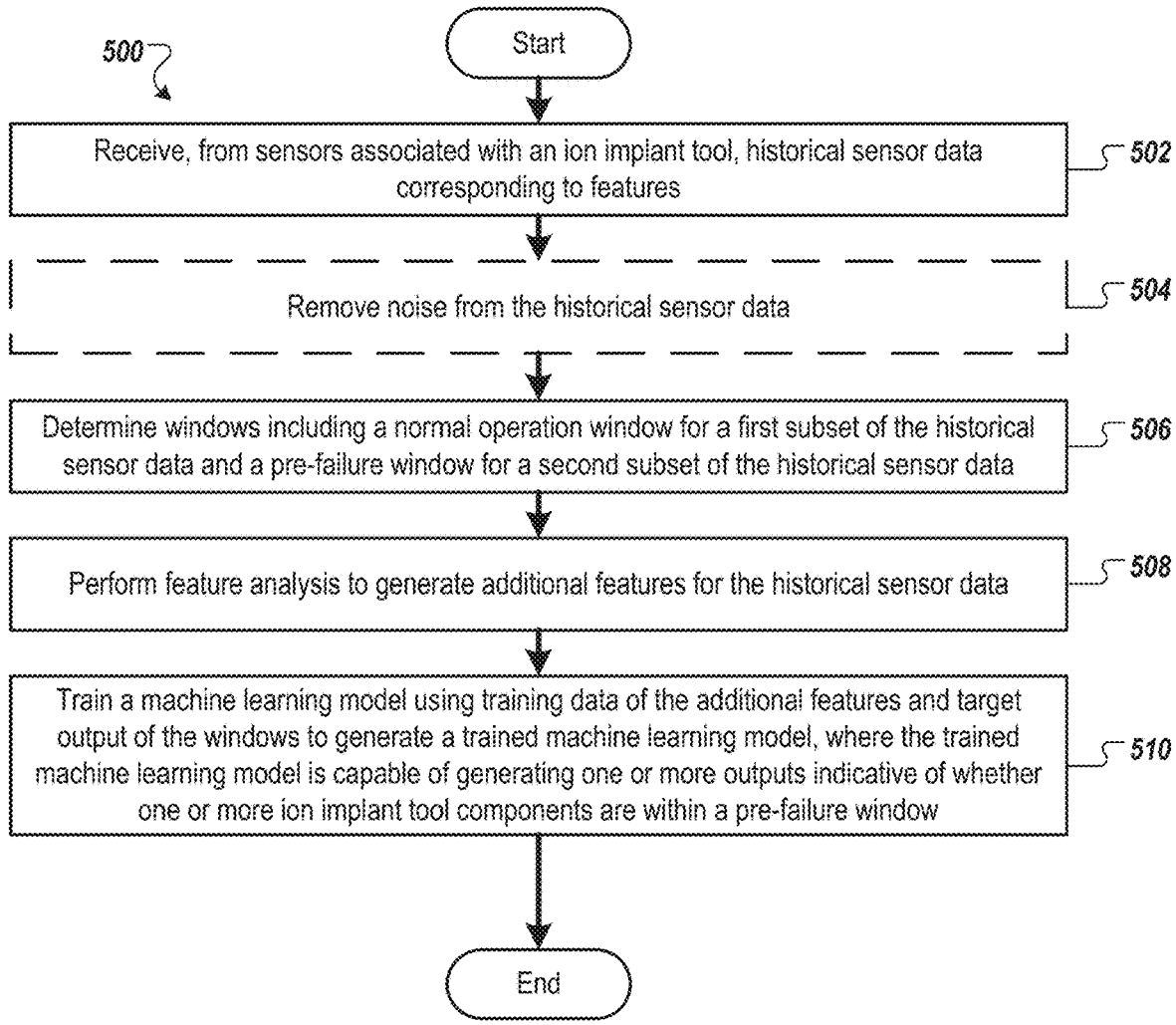
Figure 6:
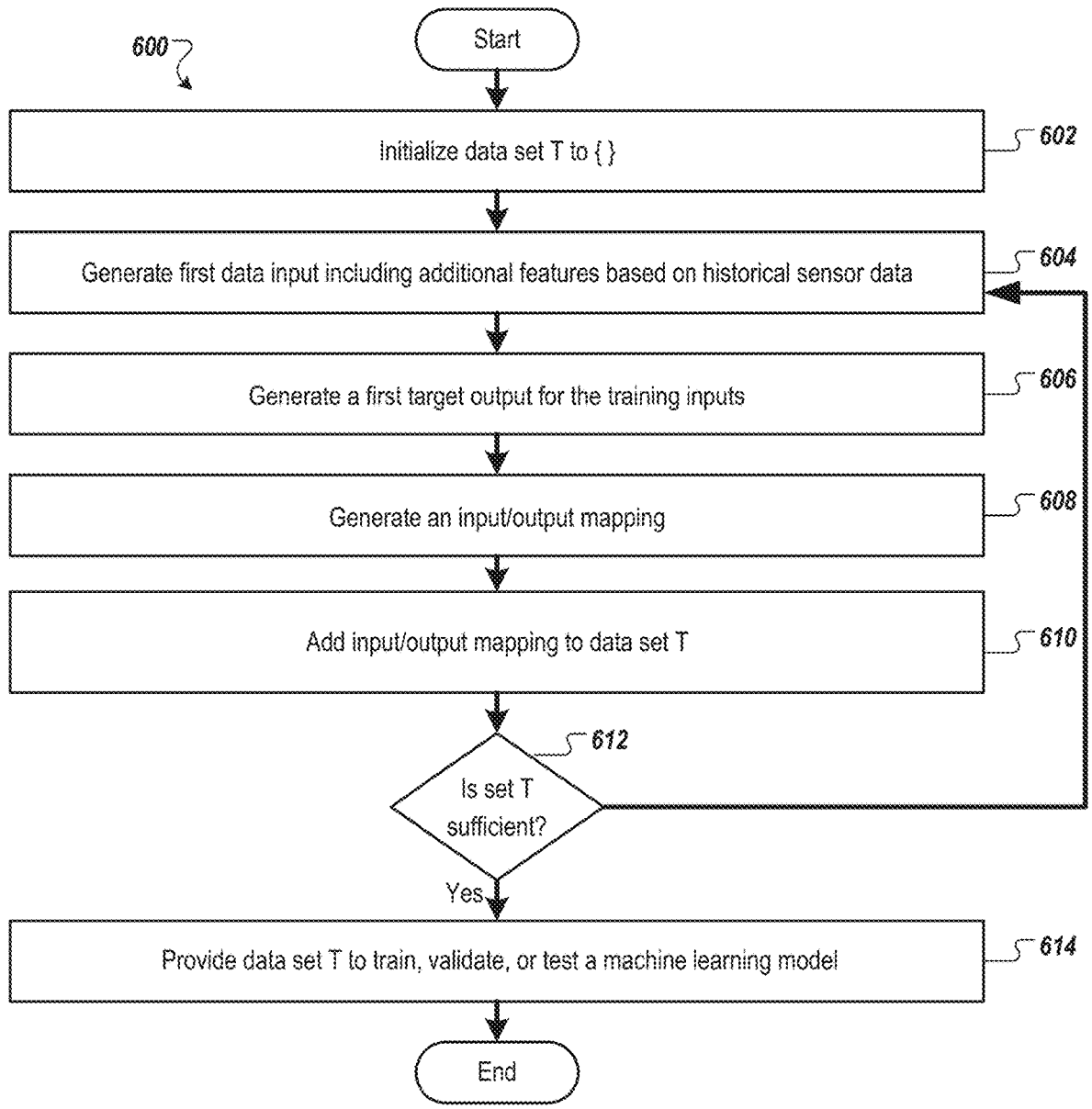

FIGS. 4-6 are flow diagrams illustrating example methods 400, 500, and 600 associated with failure prediction, according to certain embodiments. Methods 400, 500, and 600 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, methods 400, 500, and 600 may be performed, in part, by failure prediction system 110. In some embodiments, methods 400, 500, and 600 may be performed by failure prediction server 130. In some embodiments, a non-transitory computer readable storage medium stores instructions that when executed by a processing device (e.g., of failure prediction system 110) cause the processing device to perform methods 400, 500, and 600.

For simplicity of explanation, methods 400, 500, and 600 are depicted and described as a series of acts. However, acts in accordance with this disclosure can occur in various orders and/or concurrently and with other acts not presented and described herein. Furthermore, not all illustrated acts may be performed to implement the methods 400, 500, and 600 in accordance with the disclosed subject matter. In addition, those skilled in the art will understand and appreciate that the methods 400, 500, and 600 could alternatively be represented as a series of interrelated states via a state diagram or events.

FIG. 4 is a flow diagram of a method 400 for predicting component failure, according to certain embodiments. In some embodiments, method 400 is performed by processing logic of failure prediction component 132 of the failure prediction server 130.

At block 402, the processing logic receives, from sensors (e.g., sensors 126) associated with manufacturing equipment (e.g., manufacturing equipment 124, an ion implant tool), current sensor data (e.g., current sensor data 150) corresponding to features. The features may be sequences of current sensor data, where each sequence of current sensor data is captured by a corresponding sensor. In some embodiments, the current sensor data is streamed to the processing logic. The processing logic may receive the sensor data in the form of one or more of a dataset, a matrix, etc. In some embodiments, the sensor data is saved and aggregated in the data store 140.

In some embodiments, at block 404, the processing logic removes noise from the current sensor data. In some embodiments, the processing logic removes the noise from the current sensor data by averaging the current sensor data over intervals (e.g., average sensor data values over 10 second periods of time, etc.). In some embodiments, the processing logic removes the noise by removing the outliers from the current sensor data.

At block 406, the processing logic performs feature analysis to generate additional features (e.g., current additional features 154) for the current sensor data. The additional features may include one or more of a ratio, a range, a delta, or a maximum value of corresponding sensor data from one or more of the plurality of sensors. In some embodiments, the additional features may include statistical features (e.g., mean, standard deviation, etc.) of key sensors In some embodiments, the processing logic performs the feature analysis by receiving user input indicating the additional features that are to be calculated. In some embodiments, a model for feature analysis (e.g., feature engineering) is generated (see FIG. 5, based on user input of additional features, based on user input of other parameters, without user input). The model for feature analysis may be a convolutional neural network (CNN) (e.g. that performs one-dimension convolutions). The CNN may excel at learning the temporal structure in sensor data 142 and may determine invariant features for failure and normal data (e.g., for determining normal operation window, pre-failure window, etc.).

The processing logic may perform the analysis by receiving the current sensor data in a matrix and processing the matrix via one-dimensional convolutions to output the plurality of additional features.

At block 408, the processing logic provides the additional features (e.g., subsequent to the removing of the noise) as input to a trained machine learning model. The trained machine learning model may include one or more LSTM layers and a softmax layer. The trained machine learning model may have learned spatial features as sequences by the one or more LSTM layers. The time series structure may be built into the prediction. The trained machine learning model may be weighted to penalize misclassifications (e.g., to avoid having false positives). A current prediction generated by the method 400 may be based on a previous time step of the current sensor data 150.

At block 410, the processing logic obtains one or more outputs from the trained machine learning model. In some embodiments, the one or more outputs are indicative of a level of confidence (e.g., level of confidence 158) of a predicted window (e.g., predicted window 156B). In some embodiments, the processing logic extracts from the one or more outputs, the level of confidence of the predicted window. In some embodiments, the processing logic determines multiple predicted windows and corresponding levels of confidence (e.g., 10% level of confidence for a normal operation window and 90% level of confidence for a pre-failure window).

At block 410, the processing logic obtains one or more outputs from the trained machine learning model. In some embodiments, the one or more outputs are indicative of a level of confidence (e.g., level of confidence 158) of a predicted window (e.g., predicted window 156B). In some embodiments, the processing logic extracts from the one or more outputs, the level of confidence of the predicted window. In some embodiments, the processing logic determines multiple predicted windows and corresponding levels of confidence (e.g., 10% level of confidence that normal operation window and 90% level of confidence that pre-failure window).

At block 412, the processing logic predicts, based on the level of confidence of the predicted window, whether one or more components of the manufacturing equipment (e.g., ion implant tool) are within a pre-failure window. The processing logic may predict that the one or more components are within the pre-failure window by determining the level of confidence of the predicted window indicates greater than 50% confidence of the pre-failure window.

At block 414, the processing logic determines whether the level of confidence of the predicted window indicates the one or more components of the ion implant tool are within the pre-failure window. Responsive to the level of confidence of the predicted window indicating the one or more components are not within the pre-failure window, flow continues to block 402 where additional sensor data is received (e.g., a loop of method 400). Responsive to the level of confidence of the predicted window indicating the one or more components are within the pre-failure window, flow continues to block 416. The one or more components may be a component of an ion implant tool, such as at least one of a flood gun or a source gun.

At block 416, the processing logic performs a corrective action associated with the ion implant tool (e.g., responsive to predicting that the one or more components are within the pre-failure window). The corrective action may include one or more of causing a graphical user interface to display an alert, interrupting operation (e.g., shutting down, slowing speed, stopping specific processes, etc.) of the manufacturing equipment (e.g., ion implant tool), or causing the one or more components to be replaced.

At block 502, the processing logic receives, from sensors (e.g., sensors 126) associated with manufacturing equipment 124 (e.g., an ion implant tool), historical sensor data (e.g., historical sensor data 144) corresponding to features (e.g., measurement values and corresponding times stamps received from the sensors 126 associated with the manufacturing equipment 124).

At block 502, the processing logic receives, from sensors (e.g., sensors 126) associated with manufacturing equipment 124 (e.g., an ion implant tool), historical sensor data (e.g., historical sensor data 144) corresponding to features (e.g., measurement values and corresponding times stamps received form the sensors 126 associated with the manufacturing equipment 124).

In some embodiments, at block 504, the processing logic removes noise from the historical sensor data. The processing logic may remove the noise from the historical sensor data by one or more of averaging the historical sensor data over intervals or removing outliers.

At block 506, the processing logic determines windows (e.g., historical windows 156A) including a normal operation window for a first subset of the historical sensor data and a pre-failure window for a second subset of the historical sensor data. The processing logic may determine windows by determining a time of failure (e.g., based on a peak of sensor data values, based on a peak of health index values such as in FIG. 8B). The processing logic may determine sensor data captured more than a set amount of time (e.g., 24 hours, 48 hours) before the time of failure corresponds to the normal operation window, sensor data captured between the time of failure and the set amount of time before the failure corresponds to the pre-failure window, and the sensor data captured after the time of failure corresponds to the failure window.

At block 508, the processing logic performs feature analysis to generate additional features (e.g., historical additional features 148) for the historical sensor data. The additional features may include one or more of a ratio, a range, a delta, or a maximum value of corresponding sensor data from one or more of the plurality of sensors. The processing logic may perform the feature analysis by receiving the historical sensor data in a matrix and processing the matrix via one-dimensional convolutions to output the plurality of additional features.

In some embodiments, the processing logic receives user input corresponding to the additional features (e.g., operations and specific sensors associated with the additional features). The processing logic may train a CNN (e.g., based on the user input of the additional features, with user input of parameters, without user input, etc.) and the trained CNN may be used in method 400 to determine additional features (e.g., current additional features 154) for using the trained machine learning model At block 510, the processing logic trains a machine learning model (e.g., including one or more LSTM levels and a softmax layer) using training data including the additional features (e.g., subsequent to the removing of the noise) and target output including the windows to generate a trained machine learning model. The trained machine learning model may be capable of generating one or more outputs indicative of whether one or more ion implant tool components (e.g., from one or more ion implant tools, from one or more manufacturing equipment 124, etc.) are within the pre-failure window (see method 400 of FIG. 4).

In some embodiments, the processing logic trains multiple models using one or more of different features (e.g., historical features 146, historical additional features 148) or different hyperparameters. The processing logic may one or more of train, validate, or test the different models (e.g., evaluate the models) to select the model that gives the highest accuracy.

In some embodiments, the processing logic deploys the trained machine learning model to predict whether one or more components of manufacturing equipment (e.g., flood gun, source gun, etc. of ion implant tools) are within a pre-failure window for performing a corrective action (e.g., associated with one or more ion implant tools). In some embodiments, the trained machine learning model is to receive input based on current sensor data from a second plurality of sensors associated with a second ion implant tool (e.g., different than the ion implant tool used for training the machine learning model) for the predicting whether the one or more components are within the pre-failure window.

FIG. 6 is a flow diagram of a method 600 for generating a data set for a machine learning model for predicting component failure, according to certain embodiments. Failure prediction system 110 may use method 600 to at least one of train, validate, or test a machine learning model, in accordance with embodiments of the disclosure. In some embodiments, one or more operations of method 600 may be performed by data set generator 172 of server machine 170 as described with respect to FIGS. 1 and 2. It may be noted that components described with respect to FIGS. 1 and 2 may be used to illustrate aspects of FIG. 6.

Referring to FIG. 6, at block 602, the processing logic initializes a data set T to an empty set.

At block 604, the processing logic generates first data input (e.g., first training input, first validating input) that includes a first set of features for the historical sensor data (as described with respect to FIG. 2). The first data input may include one or more features (e.g., historical features 146) and/or one or more additional features (e.g., historical additional features 148) of historical sensor data (e.g., historical sensor data 144).

At block 606, processing logic generates a first target output for one or more of the data inputs (e.g., first data input). The first target output provides an indication of a historical window (e.g., historical window 156A).

At block 608, processing logic optionally generates mapping data that is indicative of an input/output mapping. The input/output mapping (or mapping data) may refer to the data input (e.g., one or more of the data inputs described herein), the target output for the data input (e.g., where the target output identifies a predicted window), and an association between the data input(s) and the target output.

At block 610, processing logic adds the mapping data generated at block 610 to data set T.

At block 614, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In some embodiments, the data set T may be partitioned into a training set, a validation set, and a testing set (e.g., the training set may be 60%, the validation set may be 20%, and the testing set may be 20%). Responsive to the machine learning model being trained (e.g., and validated, tested, and meeting a threshold accuracy), the trained machine learning model may be used (e.g., by failure prediction component 132) for failure prediction (see FIGS. 3-4).

At block 614, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In some embodiments, the data set T may be partitioned into a training set, a validation set, and a testing set (e.g., the training set may be 60%, the validation set may be 20%, and the validation set may be 20%). Responsive to the machine learning model being trained (e.g., and validated, tested, and meeting a threshold accuracy), the trained machine learning model may be used (e.g., by failure prediction component 132) for failure prediction (see FIGS. 3-4).

In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. The trained machine learning model may be implemented by failure prediction component 132 (of failure prediction server 130) to predict a failure window for one or more components.

Figure 7A:
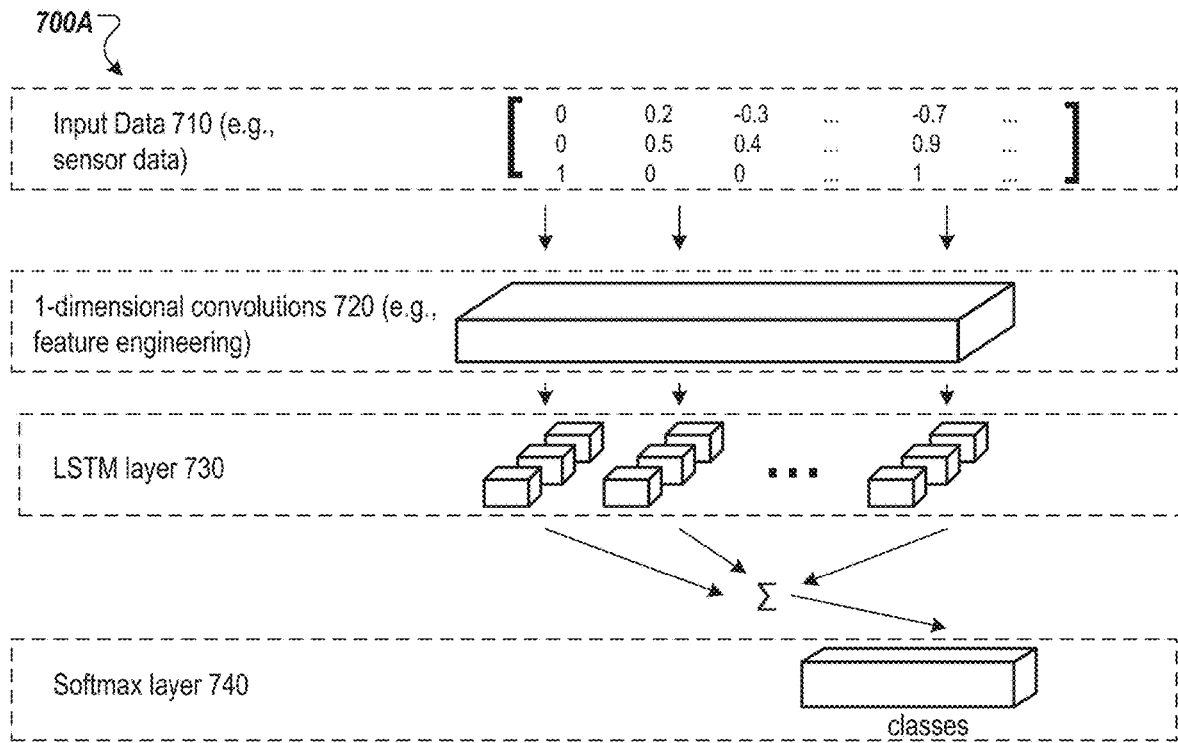
FIGS. 7A-B are block diagrams illustrating systems for predicting component failure, according to certain embodiments.
Figure 7B:
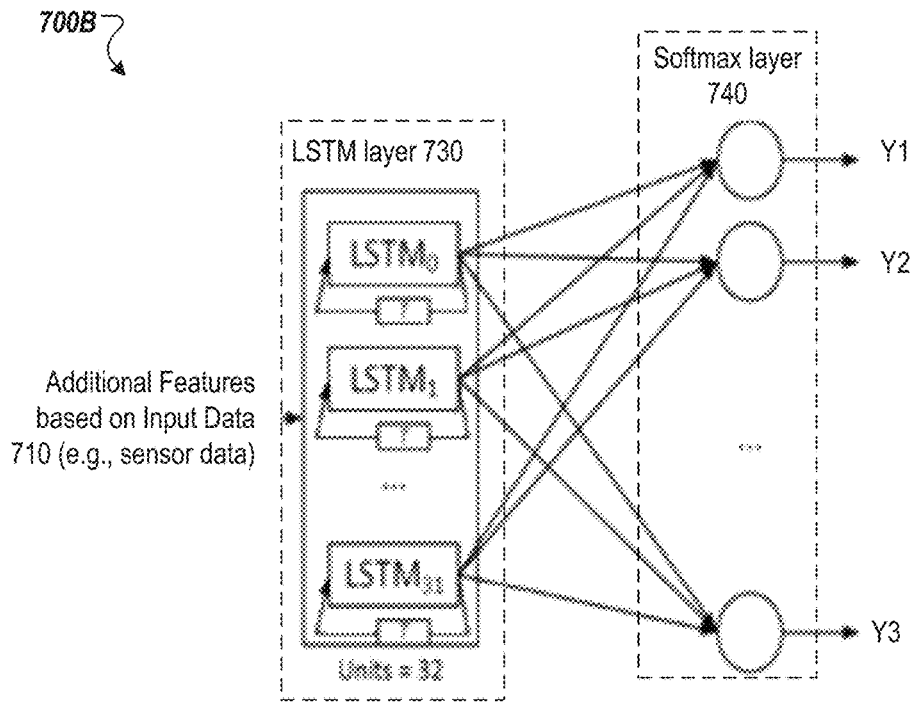

FIGS. 7A-B are block diagrams illustrating systems 700A and 700B for failure prediction, according to certain embodiments.

Referring to FIG. 7A, system 700A may receive input data 710. The input data 710 may be sensor data in a matrix. Noise may be removed from the sensor data (e.g., by averaging the raw data over intervals to generate the sensor data, by removing outliers from the sensor data).

System 700A may perform one-dimensional convolutions 720 (e.g., of a trained CNN) on the input data 710. In some embodiments a CNN (e.g., that performs one-dimensional convolutions) was trained based on user input associated with additional features (e.g., indicating the operations to be used to generate the additional features). The system 700A may perform the one-dimensional convolutions 720 on the input data 710 (e.g., subsequent to removal of noise) to perform feature analysis to generate additional features for the input data. The additional features may include one or more of a ratio, a range, a delta, a maximum value, etc. of corresponding sensor data.

System 700A may input the additional features into a LSTM layer 730 of a machine learning model. The number of LSTM layers may be a hyperparameter that is tuned by training and retraining the machine learning model based on sensor data.

Referring to FIG. 7B, system 700B includes LSTM layers 730 that may receive additional features based on the input data 710. The output of the LSTM layers 730 may transmitted to the softmax layer 740. The softmax layer may generate one or more outputs. The one or more outputs may include a corresponding level of confidence for one or more predicted windows. For example, the softmax layer may generate a first level of confidence of the normal operation window, a second level of confidence for the pre-failure window, and a third level of confidence for the failure window. The levels of confidence may add up to 100%. The window that corresponds to a level of confidence greater than 50% may be used.

Referring to FIG. 7B, system 700B includes LSTM layers 730 that may receive additional features based on the input data 710. The output of the LSTM layers 730 may transmitted to the softmax layer 740. The softmax layer may generate one or more outputs. The one or more outputs may include a corresponding level of confidence for one or more predicted windows. For example, the softmax layer may generate a first level of confidence of the normal operation window, a second window of confidence for the pre-failure window, and a third level of confidence for the failure window. The levels of confidence may add up to 100%. The window that corresponds to a level of confidence greater than 50% may be used.

Figure 8A:
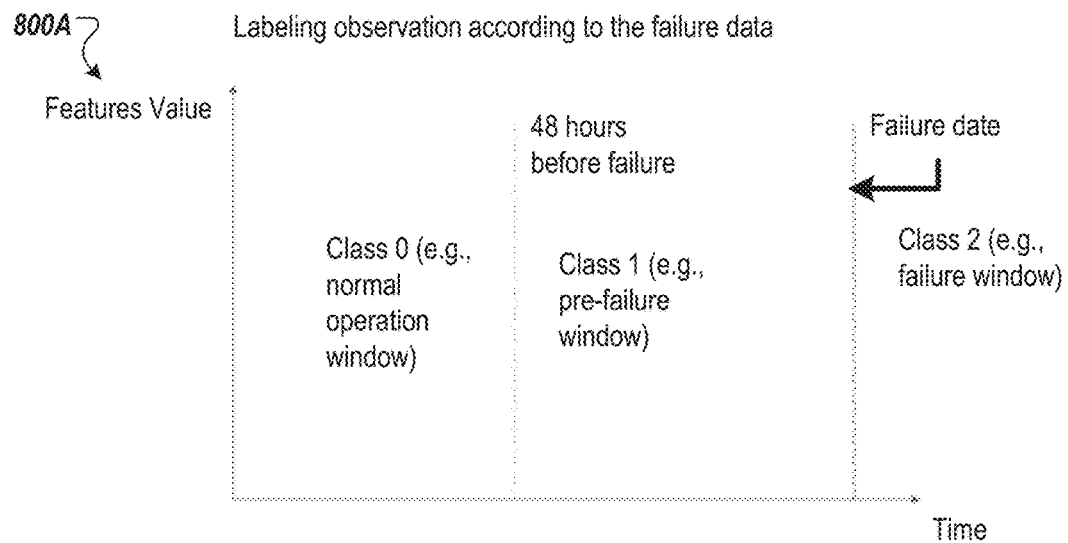
FIGS. 8A-B are graphs illustrating predicting component failure, according to certain embodiments.
Figure 8B:
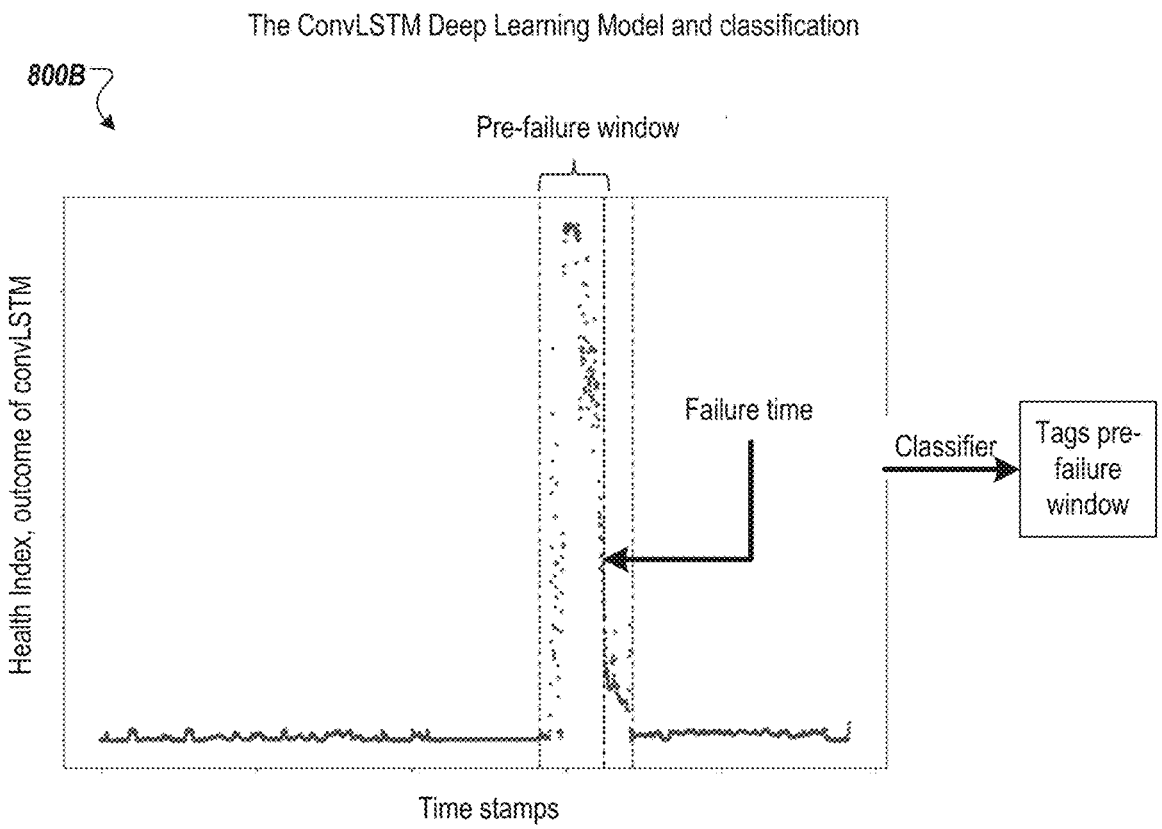

FIGS. 8A-B are graphs 800A and 800B illustrating failure prediction, according to certain embodiments.

Referring to FIG. 8A, graph 800A displays features values (e.g., historical additional features 148, current additional features 154, etc.) over time. A first window of time may correspond to class 0 (e.g., normal operation window). A second window of time may correspond to class 1 (e.g., pre-failure window). A third window of time may correspond to class 2 (e.g., failure window). Class 0 may end and class 1 may begin a set amount of time (e.g., 24 hours, 48 hours, etc.) before the failure date (e.g., historical failure date, predicted failure date). Class 1 may end and class 2 may begin at the time of failure of the one or more components. The historical sensor data may be labeled according to the corresponding window (e.g., class 0, 1, or 2).

Referring to FIG. 8B, graph 800B displays a health index plotted over time (e.g., has corresponding time stamps). The health index may be based on one or more of the outcome of convolutional LSTM, sensor data, additional features, etc.

The health index may be substantially stable over a normal operation window. During the pre-failure window, the health index may peak and substantially at time of failure, the health index may drop. A first subset of the sensor data may correspond to time stamps in the normal operation window, a second subset of the sensor data may correspond to time stamps in the pre-failure window, and a third subset of the sensor data may correspond to time stamps in the failure window. Each of the subsets of sensor data may be labeled according to the corresponding window (e.g., class).

Figure 9:
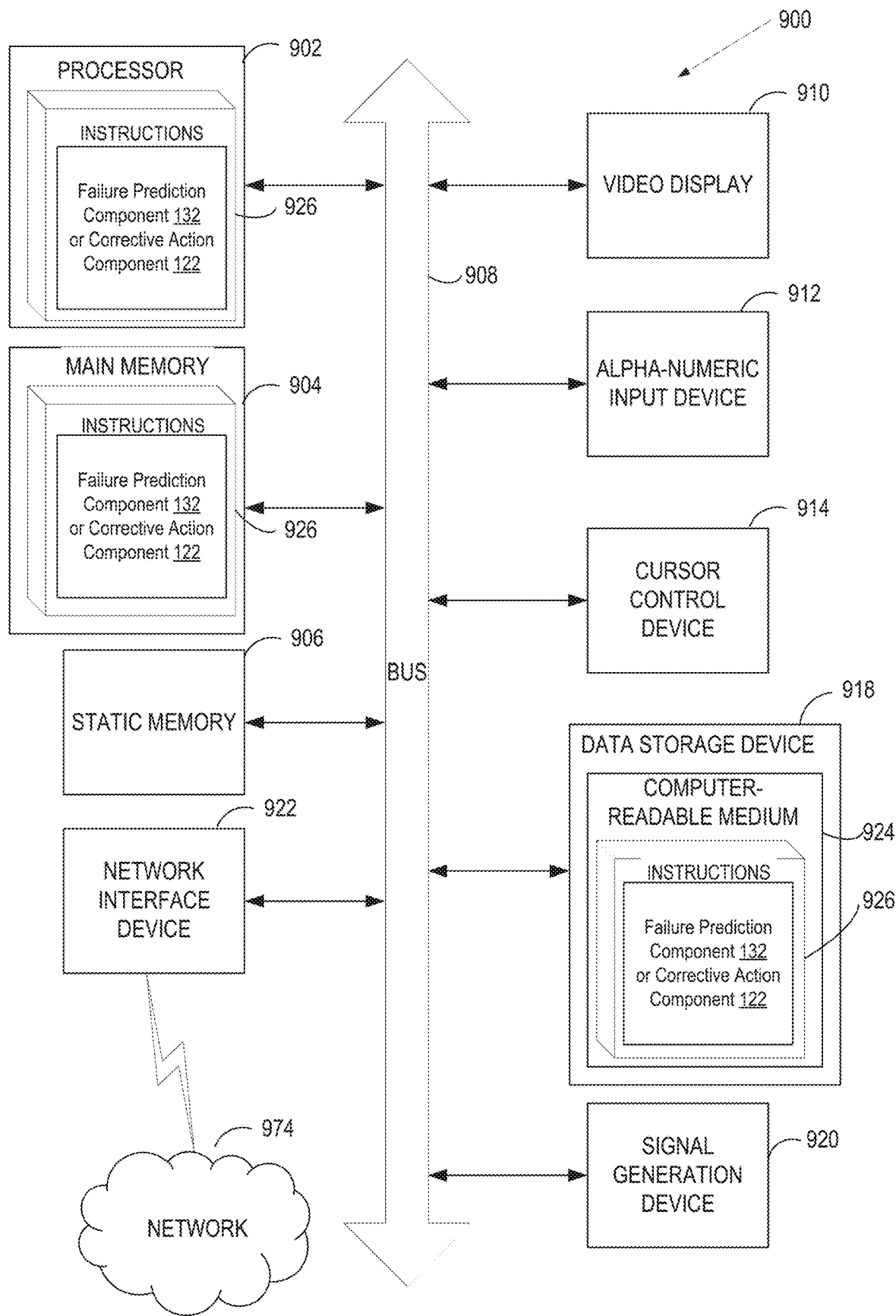
FIG. 9 is a block diagram illustrating a computer system, according to certain embodiments.

FIG. 9 is a block diagram illustrating a computer system 900, according to certain embodiments. In some embodiments, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., random access memory (RAM)), a non-volatile memory 906 (e.g., read-only memory (ROM) or electrically-erasable programmable ROM (EEPROM)), and a data storage device 916, which may communicate with each other via a bus 908.

Processing device 902 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 900 may further include a network interface device 922. Computer system 900 also may include a video display unit 910 (e.g., an LCD), an alphanumeric input device 912 (e.g., a keyboard), a cursor control device 914 (e.g., a mouse), and a signal generation device 920.

In some implementations, data storage device 916 may include a non-transitory computer-readable storage medium 924 on which may store instructions 926 encoding any one or more of the methods or functions described herein, including instructions encoding the failure prediction component 132 or corrective action component 122 of FIG. 1 and for implementing methods described herein.

Instructions 926 may also reside, completely or partially, within volatile memory 904 and/or within processing device 902 during execution thereof by computer system 900, hence, volatile memory 904 and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "extracting," "predicting," "removing," "causing," "interrupting," "determining," "training," "deploying," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
    determining, based on sensor data, that one or more components of wafer or display manufacturing equipment are within a pre-failure window that is after a normal operation window, wherein corresponding data points in the normal operation window are substantially stable along a first health index value, wherein the corresponding data points in the pre-failure window increase from the first health index value to a peak at a second health index value; and
    responsive to the determining that the one or more components are within the pre-failure window, causing performance of a corrective action associated with the one or more components of the wafer or display manufacturing equipment.

2. The method of claim 1, wherein the determining that the one or more components are within the pre-failure window comprises:
    providing the sensor data as input to a trained machine learning model; and
    obtaining, from the trained machine learning model, one or more outputs indicative that the one or more components are within the pre-failure window.

3. The method of claim 2, the trained machine learning model being trained based on historical sensor data and based on historical windows associated with the historical sensor data, the historical windows comprising the normal operation window and the pre-failure window.

4. The method of claim 1, wherein the sensor data is associated with the one or more components of the wafer or display manufacturing equipment.

5. The method of claim 1, wherein the corresponding data points of the pre-failure window decrease from the peak at the second health index value to a third health index value corresponding to a failure time at an end of the pre-failure window.

6. The method of claim 5, wherein the failure time corresponds to failure of the one or more components.

7. The method of claim 1, wherein the causing of the performance of the corrective action comprises one or more of:
- causing a graphical user interface to display an alert;
- interrupting operation of the wafer or display manufacturing equipment; or
- causing the one or more components to be replaced.

8. A method comprising:
- identifying historical sensor data associated with wafer or display manufacturing equipment; and
- identifying historical windows associated with the historical sensor data, wherein:
  - corresponding data points of the historical sensor data in a normal operation window of the historical windows are substantially stable along a first health index value;
  - the corresponding data points of the historical sensor data in a pre-failure window of the historical windows increase from the first health index value to a peak at a second health index value; and
  - the historical sensor data and the historical windows are to be used to determine, based on current sensor data, whether one or more components are within the pre-failure window to cause performance of a corrective action associated with the one or more components.

9. The method of claim 8 further comprising:
training a machine learning model using training data comprising the historical sensor data and target output comprising the historical windows to generate a trained machine learning model capable of generating one or more outputs indicative of whether the one or more components are within the pre-failure window to cause the performance of the corrective action associated with the one or more components.

10. The method of claim 8, wherein the current sensor data is associated with the one or more components of current wafer or display manufacturing equipment.

11. The method of claim 8, wherein the corresponding data points of the pre-failure window decrease from the peak at the second health index value to a third health index value corresponding to a failure time at an end of the pre-failure window.

12. The method of claim 11, wherein the failure time corresponds to failure of the one or more components.

13. The method of claim 8, wherein causing the performance of the corrective action comprises one or more of:
- causing a graphical user interface to display an alert;
- interrupting operation of the wafer or display manufacturing equipment; or
- causing the one or more components to be replaced.

14. A system comprising:
a memory; and
a processing device coupled to the memory, the processing device to:
- determine, based on sensor data, that one or more components of wafer or display manufacturing equipment are within a pre-failure window that is after a normal operation window, wherein corresponding data points in the normal operation window are substantially stable along a first health index value, wherein the corresponding data points in the pre-failure window increase from the first health index value to a peak at a second health index value; and
- responsive to determining that the one or more components are within the pre-failure window, cause performance of a corrective action associated with the one or more components of the wafer or display manufacturing equipment.

15. The system of claim 14, wherein to determine that the one or more components are within the pre-failure window, the processing device is to:
- provide the sensor data as input to a trained machine learning model; and
- obtain, from the trained machine learning model, one or more outputs indicative that the one or more components are within the pre-failure window.

16. The system of claim 15, the trained machine learning model being trained based on historical sensor data and based on historical windows associated with the historical sensor data, the historical windows comprising the normal operation window and the pre-failure window.

17. The system of claim 14, wherein the sensor data is associated with the one or more components of the wafer or display manufacturing equipment.

18. The system of claim 14, wherein the corresponding data points of the pre-failure window decrease from the peak at the second health index value to a third health index value corresponding to a failure time at an end of the pre-failure window.

19. The system of claim 18, wherein the failure time corresponds to failure of the one or more components.

20. The system of claim 14, wherein to cause the performance of the corrective action, the processing device is to one or more of:
- cause a graphical user interface to display an alert;
- interrupt operation of the wafer or display manufacturing equipment; or
- cause the one or more components to be replaced.

* * * * *